United States Patent [19]

Nakajima

[11] Patent Number: 5,303,371
[45] Date of Patent: Apr. 12, 1994

[54] ELECTRONIC VOLUME CONTROL SYSTEM

[75] Inventor: Yukihiro Nakajima, Yokohama, Japan

[73] Assignee: Shintom Co., Ltd., Kanagawa, Japan

[21] Appl. No.: 863,302

[22] PCT Filed: Oct. 31, 1991

[86] PCT No.: PCT/JP91/01492

§ 371 Date: Jun. 25, 1992

§ 102(e) Date: Jun. 25, 1992

[87] PCT Pub. No.: WO92/08281

PCT Pub. Date: May 14, 1992

[30] Foreign Application Priority Data

Oct. 31, 1990 [JP] Japan .................. 2-296453

[51] Int. Cl.[5] .............................. H03G 3/00
[52] U.S. Cl. .............................. 381/109
[58] Field of Search .......... 84/629, 633, 665; 381/104, 107, 109

[56] References Cited

U.S. PATENT DOCUMENTS

| 4,611,344 | 9/1986 | Hayama et al. | 381/109 |
|---|---|---|---|
| 4,706,294 | 11/1987 | Ouchida | 381/109 |
| 4,710,962 | 12/1987 | Matsui | 381/109 |

FOREIGN PATENT DOCUMENTS

| 57-88316 | 5/1982 | Japan . |
|---|---|---|
| 59-140520 | 9/1984 | Japan . |
| 61-158723 | 10/1986 | Japan . |
| 61-242407 | 10/1986 | Japan . |
| 62-21315 | 1/1987 | Japan . |
| 64-10713 | 1/1989 | Japan . |
| 64-10123 | 2/1989 | Japan . |
| 64-36111 | 2/1989 | Japan . |
| 64-81512 | 3/1989 | Japan . |
| 1-72718 | 5/1989 | Japan . |
| 1-143511 | 6/1989 | Japan . |
| 1-143512 | 6/1989 | Japan . |

Primary Examiner—Forester W. Isen
Attorney, Agent, or Firm—Oliff & Berridge

[57] ABSTRACT

An electronic volume control system has an UP key (1) for increasing the level of volume, a DOWN key (2) for decreasing the level of volume and a control (3) for controlling to increase or decrease the level of volume at the primary rate of volume change, based on the operation of each of the keys (1 and 2). The control (3) can set a fine adjustment mode in which the level of volume can be increased or decreased at a secondary rate of volume change which is smaller than the primary rate of volume change. The control (3) sets the fine adjustment mode when the time interval from a time point when one of the keys (1 or 2) is turned off to another time point when one of the keys (1 or 2) is subsequently turned on is within a preset time period. In order to enable the setting of the fine adjustment mode, a preset time period is set in UP-key or DOWN-key counter (10 or 11), if required. This preset time period is counted down for each unit time. If any key is turned on before the output of the counter becomes "0", the fine adjustment mode is selected.

13 Claims, 8 Drawing Sheets

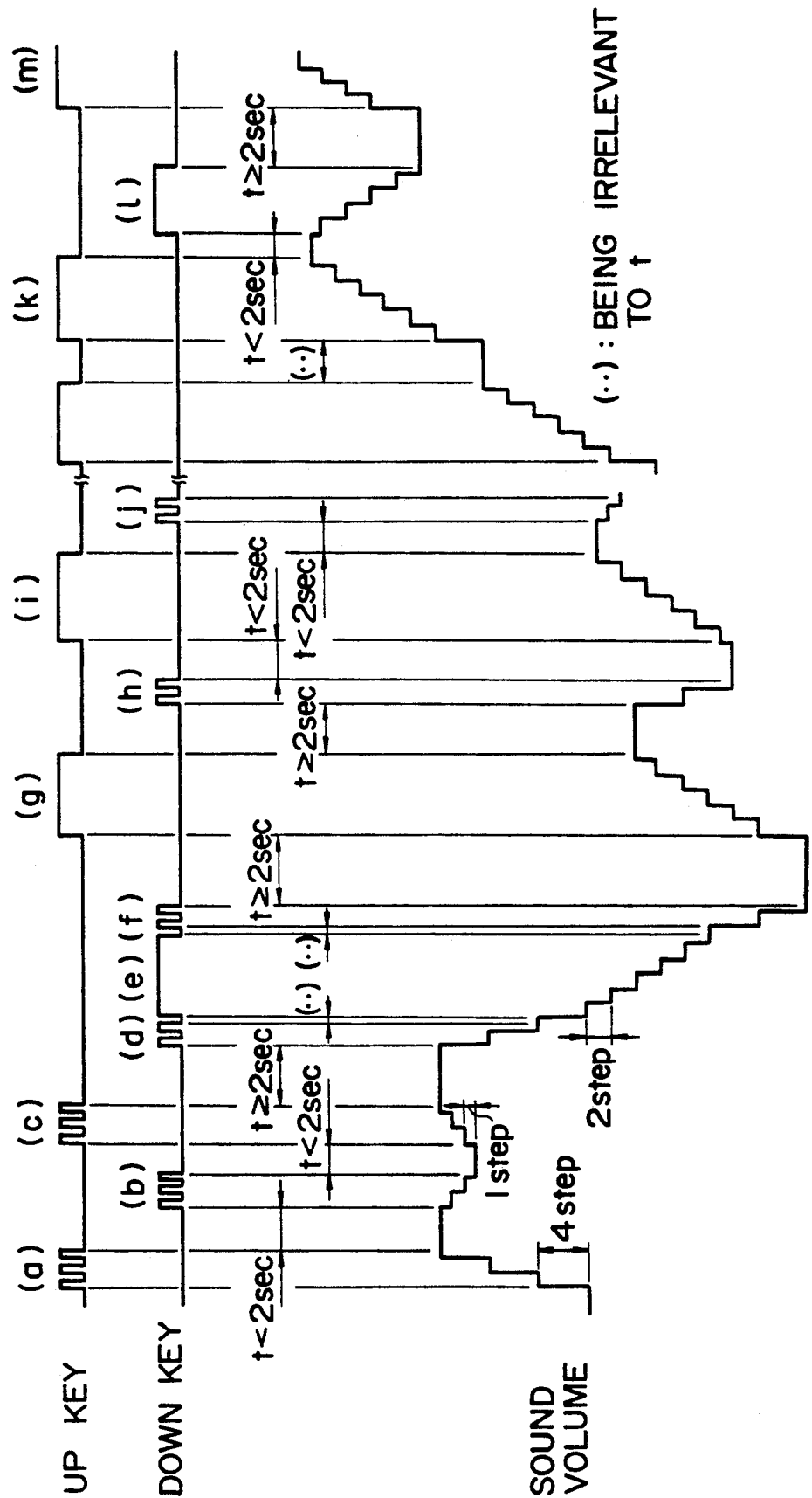

ELECTRONIC VOLUME CONTROL SYSTEM

TECHNICAL FIELD

The present invention relates to an electronic volume control system usable as to control the volume in audio instruments.

BACKGROUND ART

It is known that mechanisms for controlling the volume in audio instruments are classified into analog type and electronic type.

The analog type volume controller controls the level of volume (which is referred to "sound volume" herein) by using a variable resistor which can adjust the level of signal for regulating the sound volume. Normally, the variable resistor is adjusted by rotating a knob to an angular position corresponding to the desired sound volume.

On the other hand, a setting of sound volume has been digitized and stored in a memory. The sound volume can be adjusted when a preselected digital value is added to or subtracted from the stored value.

Such a type of electronic volume controllers are disclosed, for example, in Japanese Utility Model Laid-Open No. Sho 57-88316, Utility Model Laid-Open No. Sho 59-140520, Utility Model Laid-Open No. Sho 61-158723, Patent Laid-Open No. Sho 61-242407, Patent Laid-Open No. Sho 62-21315, Patent Laid-Open No. Sho 64-10713, Patent Laid-Open No. Sho 64-36111, Patent Laid-Open No. Sho 64-81512, Utility Model Laid-Open No. Hei 1-72718, Patent Laid-Open No. Hei 1-143511 and Patent Laid-Open No. Hei 1-143512.

The electronic volume controller generally comprises an operation button for increasing the sound volume (which will be referred to as "UP key") and another operation button for decreasing the sound volume (which will be referred to as "DOWN key"). When the UP key or DOWN key is once turned off immediately after it has been turn on (this operation will be referred to as "single operation"), the preselected value is once added to or subtracted from the setting value of sound volume stored in the memory. Thus, the sound volume will be increased or decreased by a given amount of volume change. Such a volume control mode will be referred to as "single operation mode".

The electronic volume controllers frequently have such a function that when the UP key or DOWN key is maintained at its ON state for a time period exceeding a preselected time period (this operation will be referred to as "continuous operation"), the preselected value is added to or subtracted from the setting value of sound volume stored in the memory at each unit time so as to increase or decrease the sound volume by an amount of volume change at each unit time until the UP key or DOWN key is turned off. This volume control mode will be referred to as "continuous operation mode".

However, the conventional electronic volume controllers are disadvantageous in that they are inferior in operability to the analog type volume controller.

The analog type volume controller is very easy to be operated since a desired sound volume can be obtained merely by rotating a knob, as described above. More particularly, an operator is only required to rotate the knob rapidly to a position near a desired sound volume level and then to rotate the knob gradually to a position accurately corresponding to the desired sound volume level.

The electronic volume controller uses the continuous operation mode when it is desired to increase or decrease the sound volume rapidly to a position near a desired sound volume. When such a position is reached, both the UP and DOWN keys are used to fine adjust the sound volume in the single operation mode. In such a time, the sound volume will not be adjusted depending on the sense of the operator's finger(s), unlike the analog type volume controller. Therefore, it cannot be avoided that the operator feels cumbersome in handling the electronic volume controller for such a reason why the operator cannot sensuously detect the accurate relationship between the key operation and the volume change in each of the single and continuous operation modes.

There is further known an electronic volume controller which can be adjusted by a rotatable knob. Since such a rotatable knob extends outwardly from the console panel of the controller, the knob frequently provides any obstruction. It is thus desired that the electronic volume controller can have UP and DOWN keys capable of adjusting the sound volume in conformity with the human's sense.

It is therefore an object of the present invention to provide an electronic volume controller improved in operability.

DISCLOSURE OF INVENTION

To this end, the present invention provides an electronic volume control system comprising a first operation button for varying the level of volume in the positive direction, a second operation button for varying the level of volume in the negative direction, and control means for increasing or decreasing the level of volume by a given amount of volume change in response to the operation of said first or second operation button, said control means being capable of being set at a fine adjustment mode in which the level of volume can be increased or decreased by another amount of volume change less than said given amount of volume change, whereby said fine adjustment mode can be set if a time interval from a time point when one of said first and second operation buttons is turned off to another time point when one of said first and second operation buttons is turned on is within a preselected time period.

Said control means is preferably set at its fine adjustment mode only when the operation button previously turned off is different from the operation button subsequently turned on. This can be applied if the preceding and subsequent operations are carried out by a single operation.

The control means is in one of two volume level adjustment modes, that is, a single operation mode in which the volume of volume is varied by a first amount of change each time when the first or second operation button is singly operated, and a single operation fine adjustment mode in which the level of volume is varied by a second amount of volume change less than said first amount of volume change each time when said operation button is singly operated and if a time interval from a time point when one of said first and second operation buttons is turned off to another time point when the other operation button changing the level of volume in the direction opposite to that of said one operation button is turned on is within a first preset time period.

The control means preferably continues to perform the single operation fine adjustment mode so far as a time interval of operations of the same operation button through which its single operation is repeated after setting of said single operation fine adjustment mode is within a second preset time period. It is however preferred that if the time interval exceeds said second preset time period, said single operation fine adjustment mode is released. If the second preset time period is equal to the first preset time period, the control means requires only one counting means which can judge whether the time interval is within the first or second preset time period.

For the volume level adjustment, the control means can include, in addition to the single operation mode, a continuous operation mode in which the level of volume is varied by a third amount of volume change for each unit time during a continuous operation that the first or second operation button is maintained at its ON state for a third preset time period, and a continuous operation fine adjustment mode in which the level of volume is varied by a fourth amount of volume change less than the third amount of volume change for each unit time if a time interval from a time point when one of the first and second operation buttons singly operated is turned off to another time point when the other operation button changing the level of volume in the direction opposite to that of said one operation button is turned on in a continuous operation is within the first preset time period. This continuous operation fine adjustment mode can be applied to case where the operation button previously operated by a single operation is the same as the operation button subsequently operated in the continuous operation mode.

For the volume level adjustment, the control means may include, in addition to the single and continuous operation modes, a single operation fine adjustment mode in which the volume level is varied by a sixth amount of volume change less than the first amount of volume change if a time interval from a time point when one of the first and second operation buttons in a continuous operation is turned off to another time point when the other operation button changing the level of volume in the direction opposite to that of said one operation button is turned on by a single operation is within the first preset time period. This single operation fine adjustment mode can be also applied to case where the operation button previously operated by a continuous operation is the same as the operation button previously operated by a single operation. The single operation fine adjustment mode can be released, as described.

For the volume level control, the control means may include, in addition to the continuous operation mode, a continuous operation fine adjustment mode in which the level of volume is varied by an eighth amount of volume change less the third amount of volume change for each unit time if a time interval from a time point when one of the first and second operation buttons operated by a continuous operation is turned off to another time point when the other operation button changing the level of volume in the direction opposite to that of said one operation button is turned on by a continuous operation is within said first preset time period. This continuous operation fine adjustment mode can be also applied to case where the operation button previoualy operated by a continuous operation is the same as the operation button subsequently operated by a continuous operation.

Based on a time interval from the preceding button operation to the subsequent button operation, the electronic volume control system of the present invention judges whether an operation button is subsequently operated by an operator in connection with the preceding button operation or independently or whether or not it is desired to regulate the sound volume rapidly to near the desired level before a fine adjustment is carried out. Alternatively, the volume control system judges, in addition to the above judgment, whether or not the operation button previously operated is different from the operation button subsequently operated and also whether the preceding and subsequent button operations are carried out by a continuous operation. In response to these judgments, the volume control system sets the fine adjustment mode such that the level of volume can be finely regulated with a reduced amount of volume change.

BRIEF DESCRIPTION OF DRAWINGS

FIG. 2 is a timing chart illustrating how the amount of volume change is determined in the electronic volume control system shown in FIG. 1.

BEST MODE FOR CARRYING OUT THE INVENTION

The present invention will now be described in connection with a mode where an electronic volume control system constructed in accordance with the present invention is applied as a sound volume control means in an audio system.

First Embodiment

Figure 1:
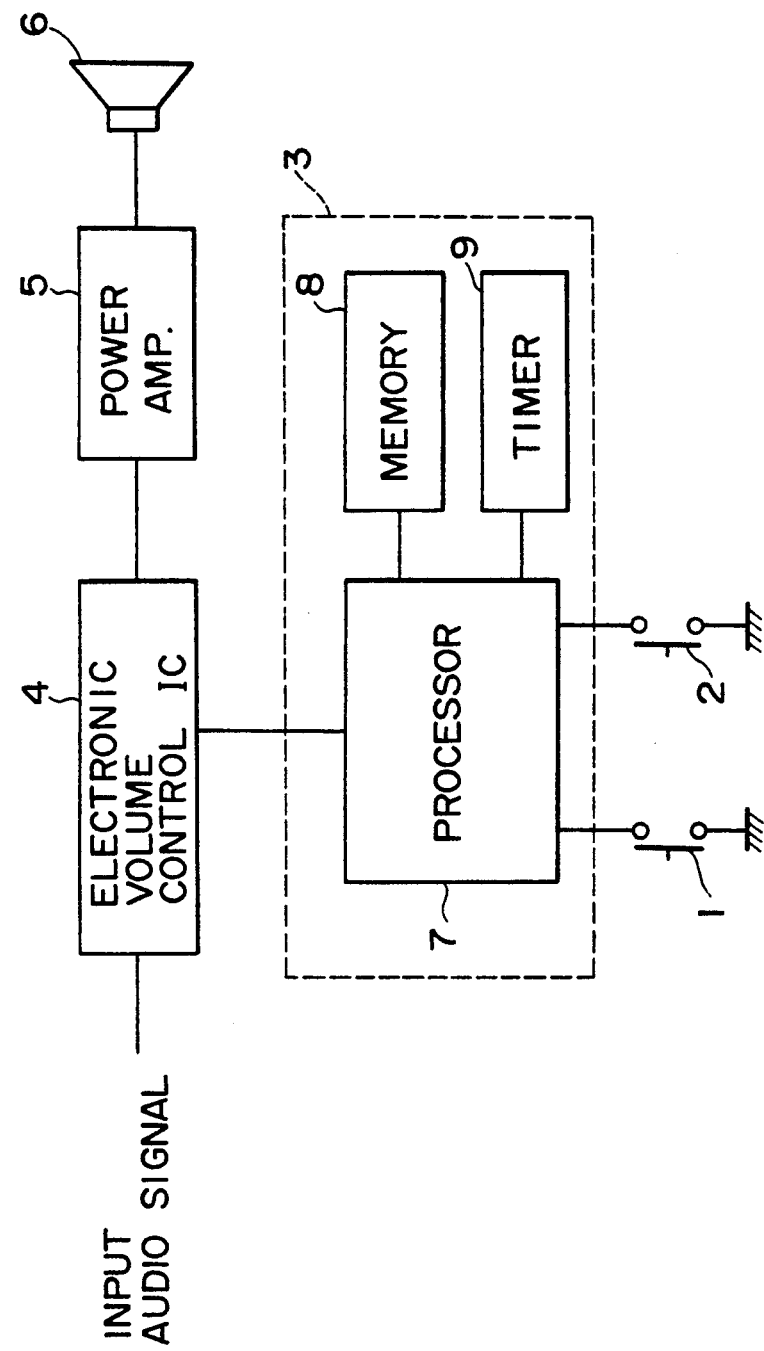
FIG. 1 is a block diagram of a first embodiment of an electronic volume control system constructed in accordance with the present invention.

Referring to FIG. 1, the electronic volume control system of the present invention comprises an UP key 1 and a DOWN key 2. When one of these UP and DOWN keys 1 or 2 is operated, a processing circuit 7 in a control circuit 3 determines a value to be added to or subtracted from volume signals, based on a value inputted from a timer 9. The timer 9 counts a time interval from a time point when one of the keys 1 or 2 is turned off to another time point when one of the keys 1 or 2 is turned on and outputs it. The timer 9 also performs a counting for judging whether the key is operated in the single or continuous operation mode. The processing circuit 7 reads out the present level of volume and the amount of volume change corresponding to the succeedingly selected mode from a memory 8, on which the level of volume is calculated. The processing circuit 7 further causes the memory 8 to store the calculated volume level and at the same time outputs it to an electronic volume IC 4. The electronic volume IC 4 is in response to the received volume level to determine the sound volume to be outputted by a speaker 6, based on which sound volume the input audio signals are transformed. It is now assumed that in this embodiment, the sound volume is increased or decreased by one step (e.g. 2 dB) as the amount of volume change in the volume signal is increased or decreased by "1". The input audio signals transformed by the electronic volume IC 4 are amplified by a power amplifier 5, the amplified signals being then fed to the speaker 6 whereat these signals are converted into voice.

The relationship between the operation of the UP and DOWN keys 1, 2 and the sound volume will be described below.

In this embodiment, it is assumed that the value of addition or subtraction induced in the control circuit 3 from the operation of the UP or DOWN key 1 or 2 is as follows:

(1) Four steps/one operation in the single operation mode;
(2) One step/one operation in the single operation fine adjustment mode; and
(3) Two steps/200 msec. in the continuous operation mode.

The "single operation mode" is one that the key operation is singly performed during the third preset time period (e.g. 200 msec.) after one of the UP key 1 or DOWN key 2 has been turned on and also that is selected at any mode other than the "single operation fine adjustment mode".

The "continuous operation mode" is selected when the operation key is maintained at its ON state for a time period exceeding the third preset time period.

The "single operation fine adjustment mode" is automatically selected when a time interval t from the precedent OFF operation to the present ON operation is less than the first preset time period $\Delta t$ (e.g. two seconds in this embodiment) and if the previously operated key is different from the key succeedingly operated by the single operation, irrespectively of whether the precedent key operation is the single or continuous operation mode. The single operation fine adjustment mode is continued when a time interval from one key operation to another key operation in the same key repeatedly operated in the single operation mode is within the second preset time period (e.g. two seconds in this embodiment). If the time interval exceeds the second preset time period, the single operation fine adjustment mode is released.

FIG. 2 shows a timing chart illustrating a volume control carried out according to the respective modes.

(a) This stage represents when the UP key 1 is initially operated by a single operation after the electronic volume control system has been started. In this case, the single operation mode is selected to increase the sound volume at the rate of four steps/one operation.

(b) This stage is obtained when the DOWN key 2 is turned on by a single operation within a time period less than two seconds from the OFF operation of the stage (a). In this case, the single operation fine adjustment mode is selected to decrease the sound volume at the rate of one step/one operation.

(c) This stage is accomplished when the UP key 2 is operated by a single operation within a time period less than two seconds from the OFF operation of the stage (b). The single operation fine adjustment mode is selected to increase the sound volume at the rate of one step/one operation.

As shown in the stages (b) and (c), the single operation fine adjustment mode is selected when one of the operation keys different from the previous operation key is operated by a single operation before two seconds elapses from the preceding OFF operation.

(d) This stage is one that the DOWN key 2 is operated by a single operation after two seconds have elapsed from the OFF operation in the stage (c). The single operation mode is selected to decrease the sound volume at the rate of four steps/one operation since two seconds has elapsed from the preceding OFF operation.

(e) This stage is one that the DOWN key 2 is operated in a continuous operation mode.

As the DOWN key 2 is turned on, the control circuit 3 of this embodiment cannot promptly judge whether the DOWN key 2 is operated by a single or a continuous operation. In such a case, this embodiment is so adapted that the first change of sound volume follows the single operation mode since the previously operated key is the same as the subsequently operated key and that the key operation is shifted to the continuous operation mode if the key is maintained at its ON state after passage of the third preset time period from the key operation (which is 200 msec. in this embodiment). In the stage (e), thus, the sound volume will be first decreased by four steps and then by two steps/200 msec. Since the same key is succeedingly operated in this case, the sound volume is controlled in the above mode, irrespectively of whether or not the time interval is less than two seconds.

(f) This stage shows the DOWN key 2 operated by a single operation. Since the previously operated key is the same as the succeedingly operated key in this stage (f), the single operation mode will be selected to reduce the sound volume at the rate of four steps/one operation, irrespectively of whether or not a time interval from the key operation of the stage (e) is less than two seconds.

(g) This stage represents that the UP key 1 is operated by a continuous operation. For the same reason as in the stage (e), the sound volume is first increased by four steps and thereafter by two steps/200 msec.

(h) In this stage, the DOWN key 2 is operated by a single operation after two seconds have elapsed from the key-off operation in the stage (g). The single operation mode is selected to decrease the sound volume at the rate of four steps/one operation.

(i) This stage represents that the UP key 1 is operated by a continuous operation in less than two seconds from the OFF operation of the stage (h). For the same reason as in the stage (e), the sound volume is first increased by one step (in accordance with the fine adjustment mode since the previously and succeedingly operated keys are different from each other). Thereafter, the sound volume is increased at the rate of two steps/200 msec..

(j) In this stage, the DOWN key 2 is operated by a single operation; a time interval from the key-off operation in the stage (i) is less than two seconds; and the previously and succeedingly operated keys are different from each other. The fine adjustment mode is thus selected to decrease the sound volume at the rate of one step/one operation.

(k) The UP key 1 is operated in the continuous operation mode. From the fact that the previously operated key is the same as the succeedingly operated key, the sound volume is first increased by four steps and then at the rate of 2 steps/200 msec..

(l) This stage shows that the DOWN key 2 is operated by a continuous operation. For the same reason as in the stage (e), the sound volume is first decreased by one step (in accordance with the fine adjustment mode) and then at the rate of two steps/200 msec..

(m) This stage shows that the UP key 1 is operated by a continuous operation. For the same reason as in the stage (e), the sound volume is first increased by four steps and then at the rate of two steps/200 msec..

In stages other than the above stages, the level of sound volume will be controlled in accordance with the volume level control modes (1), (2) and (3) aforementioned.

In such a manner, this embodiment is adapted to determine the amount of sound volume change on selection of the single operation mode, depending on the time interval from the preceding key-off operation to the present key-on operation and whether or not the previously operated key is the same as the succeedingly operated key. Therefore, the operator can more easily control the sound volume into the desired level.

Although this embodiment has been described as to the electronic volume controller including the single and continuous operation modes for controlling the sound volume, the present invention may be similarly applied to an electronic volume controller having only a single operation mode with fine adjustment.

Second Embodiment

The second embodiment of an electronic volume controller constructed in accordance with the present invention will be described below.

When a time interval t from the preceding key-off operation to the present key-on operation is less than the first preset time period $\Delta t$ (e.g. two seconds) and if the preceding key operation is in the continuous operation mode and a present key operation is in the single operation mode, the second embodiment is automatically adapted to select the fine adjustment mode even if the previously operated key is the same as the succeedingly operated key. This is different from the electronic volume controller of the first embodiment.

Figure 3A:
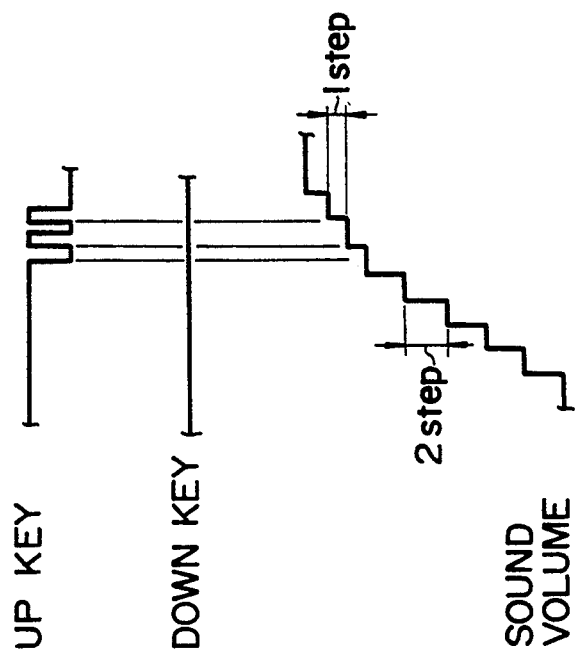
FIG. 3 is a timing chart illustrating the single operation fine adjustment mode after a continuous operation in a second embodiment of an electronic volume control system constructed in accordance with the present invention.

FIG. 3(A) shows a modification of the operation corresponding to the stage (f) of FIG. 2. When in the stage (e), the DOWN key 2 is operated by a single operation in less than two seconds after the same DOWN key 2 in a continuous operation has been turned off, the control circuit 3 selects the fine adjustment mode to decrease the sound volume at the rate of one step/one operation.

Figure 3B:
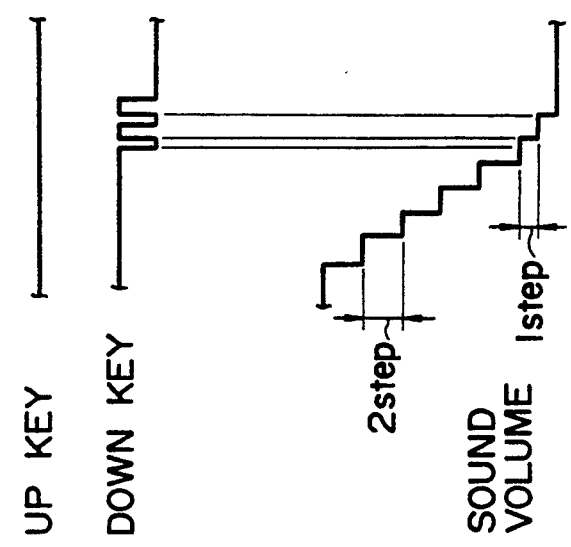

FIG. 3(B) shows that the sound volume is increased in the fine adjustment mode after it has been increased in the continuous operation mode, in contrast with that of FIG. 3(A). Similarly, the control circuit 3 selects the fine adjustment mode to increase the sound volume at the rate of one step/one operation when the UP key 1 is operated by a single operation in less than two seconds after the same UP key 1 has been turned off.

Since the fine adjustment mode is selected even if a key is previously operated in the continuous operation mode and also the same key is lately operated and when the time interval between these two key operations is less than two seconds, the sound volume can be more easily adjusted.

Although this embodiment is such that the amount of sound volume change when the different key from the previously operated key is operated to select the fine adjustment mode is the same as that when the same key as the previously operated key is operated to select the fine adjustment mode, the amounts of sound volume change different from each other may be used.

Third Embodiment

The third embodiment of an electronic volume controller constructed in accordance with the present invention will be described below.

The third embodiment is set such that the fine adjustment mode is selected when the time interval t from the preceding key operation to the subsequent key operation is less than a preset time period $\Delta t$ (e.g. two seconds) and even if the continuous operation mode was selected.

Further, the third embodiment will not judge whether or not the previously operated key is the same as the succeedingly operated key.

In this embodiment, values to be added or subtracted at the control circuit 3 when the continuous operation mode is selected are as follows:

(1) Four steps/200 msec. in the continuous operation mode; and (2) Two steps/200 msec. in the contiuous operation fine adjustment mode.

Values to be added or subtracted at the control circuit 3 when the single operation mode is selected are the same as those of the first embodiment.

Figure 4A:
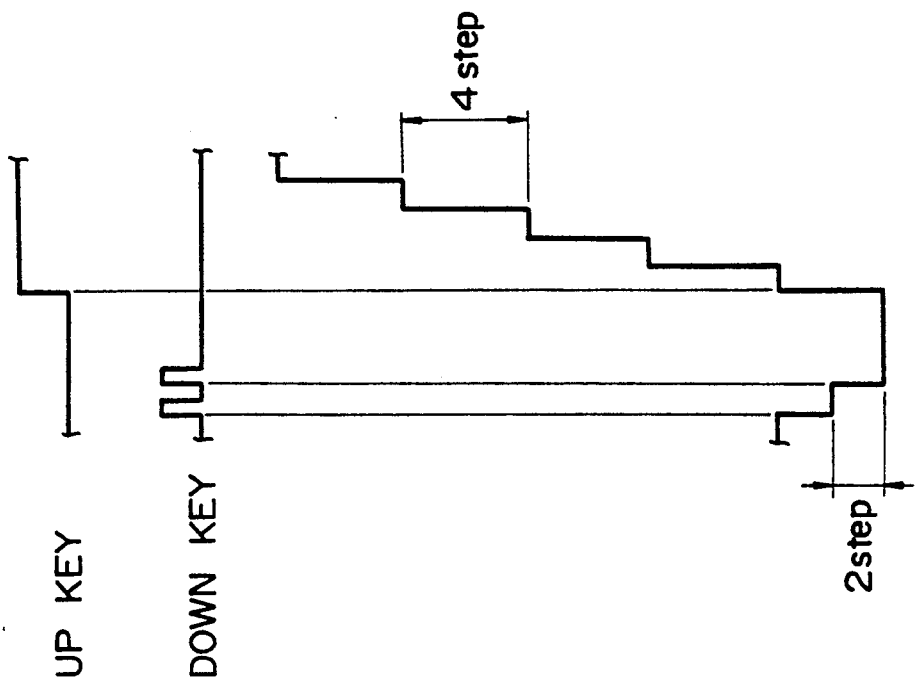
FIG. 4 is a timing chart illustrating how the amount of volume change is determined in a third embodiment of an electronic volume control system constructed in accordance with the present invention.

FIG. 4(A) shows a modification of the operation corresponding to the stage (e) of FIG. 2. After the UP key 1 or DOWN key 2 has been operated and when the UP key 1 or DOWN key 2 is again turned on in less than two seconds to select the continuous operation mode, the control circuit 3 selects the fine adjustment mode to vary the sound volume at the rate of two steps/200 msec., rather than the rate of four steps/200 msec.

Figure 4B:
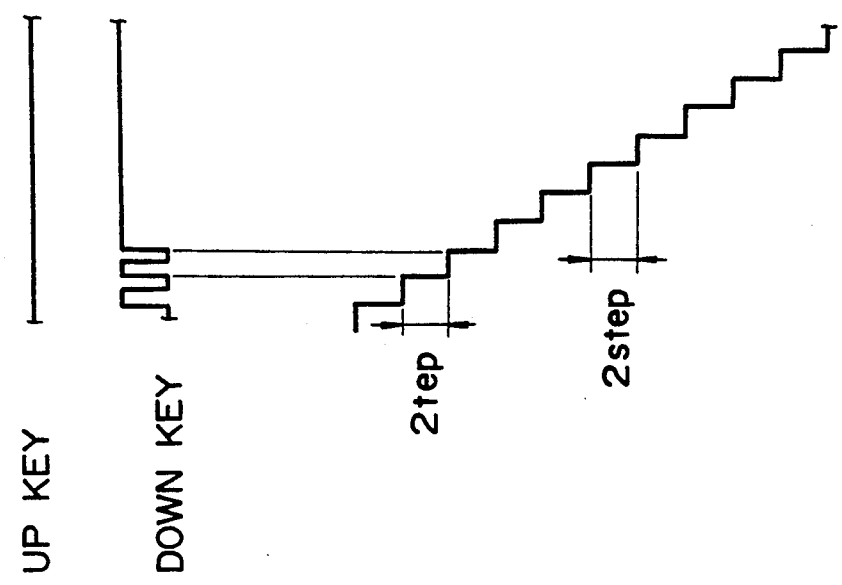

On the other hand, when the UP key 1 or DOWN key 2 is turned on to select the continuous operation mode after passage of a time period exceeding two seconds from the key-off operation of the UP key 1 or DOWN key 2, the control circuit 3 varies the sound volume at the rate of four steps/200 msec., as shown in FIG. 4(B).

If the values to be added or subtracted in the continuous operation mode become different depending on the time interval between the preceding and subsequent key operations, the operator can more easily control the sound volume into the desired level.

Although it has been described that this embodiment does not judge whether or not the previously operated key is the same as the subsequently operated key, it may be modified such that the fine adjustment mode is selected only when the key different from the previously operated key is operated.

Moreover, the amount of sound volume change when the different key is operated to select the fine adjustment mode may be different from that when the same key is operated to select the fine adjustment mode.

Fourth Embodiment

Figure 8:
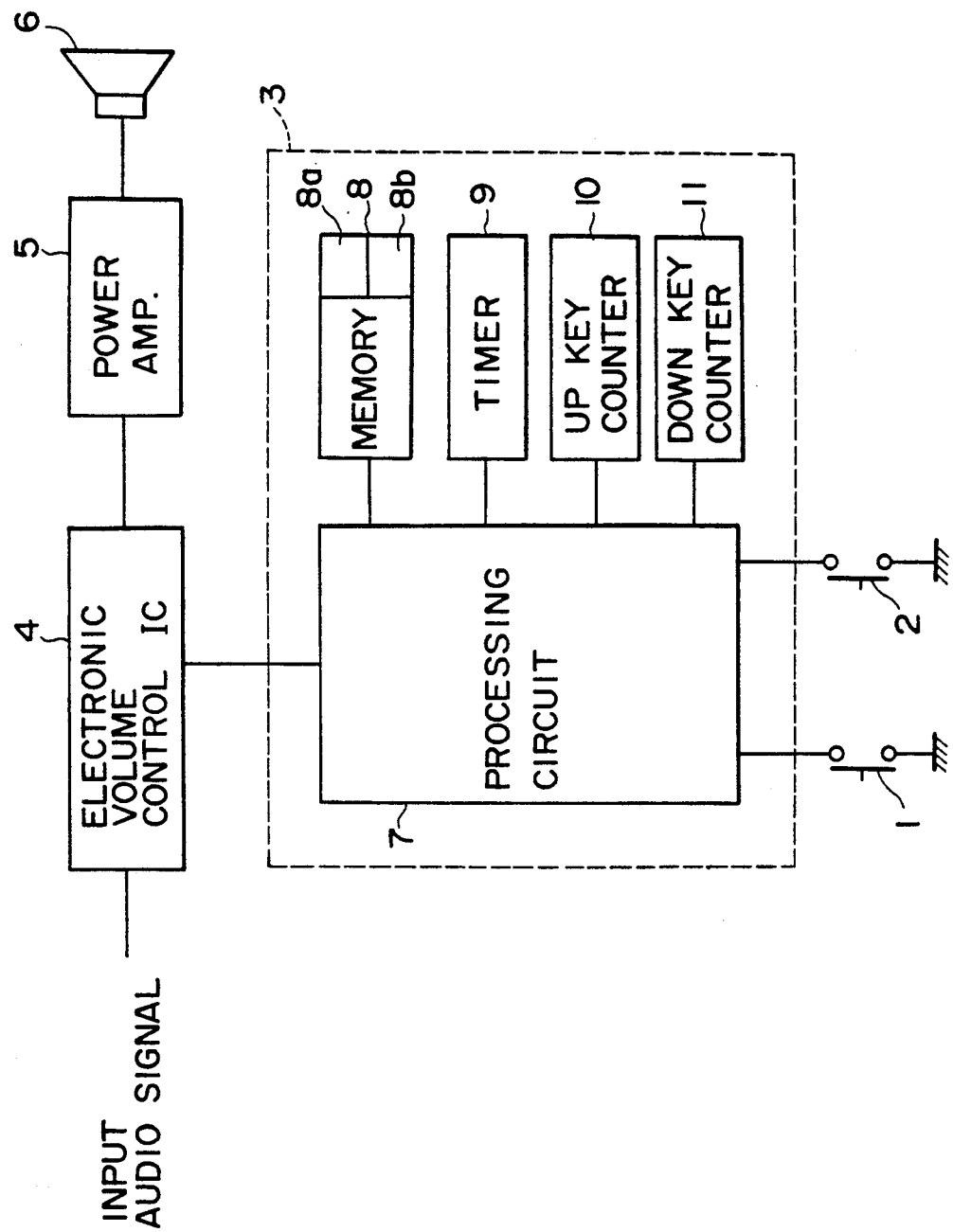
FIG. 8 is a block diagram of the fourth embodiment of an electronic volume control system constructed in accordance with the present invention.

FIG. 8 shows the fourth embodiment of an electronic volume controller constructed in accordance with the present invention. In addition of the arrangement shown in FIG. 1, the processing circuit 7 of the fourth embodiment is connected to UP-key and DOWN-key counters 10, 11. Further, the memory 8 includes a first flag area 8a and a fine-adjustment flag area 8b.

In this embodiment, values to be added or subtracted at the control circuit 3 in response to the operation of the UP key 1 or DOWN key 2 are as follows:

(1) Four steps/one operation in the single operation mode;

(2) One step/one operation in the single operation fine adjustment mode;

(3) Four steps/200 msec. in the continuous operation mode; and (4) Two steps/200 msec. in the continuous operation fine adjustment mode.

The single operation fine adjustment mode is selected if the single operation has been previously carried out and when the single key-on operation changing the level of volume in the direction opposite to that of the preceding key operation is performed in less than the first preset time period (e.g. two seconds). Furthermore, the single operation fine adjustment mode is selected if the continuous operation mode has been previously carried out and when the single key-on operation is made in less than two seconds, irrespectively of whether or not the direction of changing the level of volume is the same as that of the preceding key operation. After selected, the single operation fine adjustment mode continues so far as the time interval when the same key is repeatedly turned on and off is in less than the second preset time period (the same as the first preset time period, that is, two seconds in this embodiment).

The continuous operation fine adjustment mode is selected when the continuous key-on operation is within the time interval less than two seconds, irrespectively of whether the preceding key operation is in the single or continuous operation mode and also irrespectively of whether or not the direction of changing the level of volume is the same as that of the preceding key operation.

The first and second preset time period equal to two seconds are counted by the UP-key counter 10 and DOWN-key counter 11, respectively. More particularly, a value representing two seconds has been set in one or both of the counters 10 and 11 at a certain timing. Such a value will be counted down. After passage of two seconds, the outputs of the counters 10 and 11 become "0". If so done, it is judged that the time interval passed through two seconds.

Figure 5:
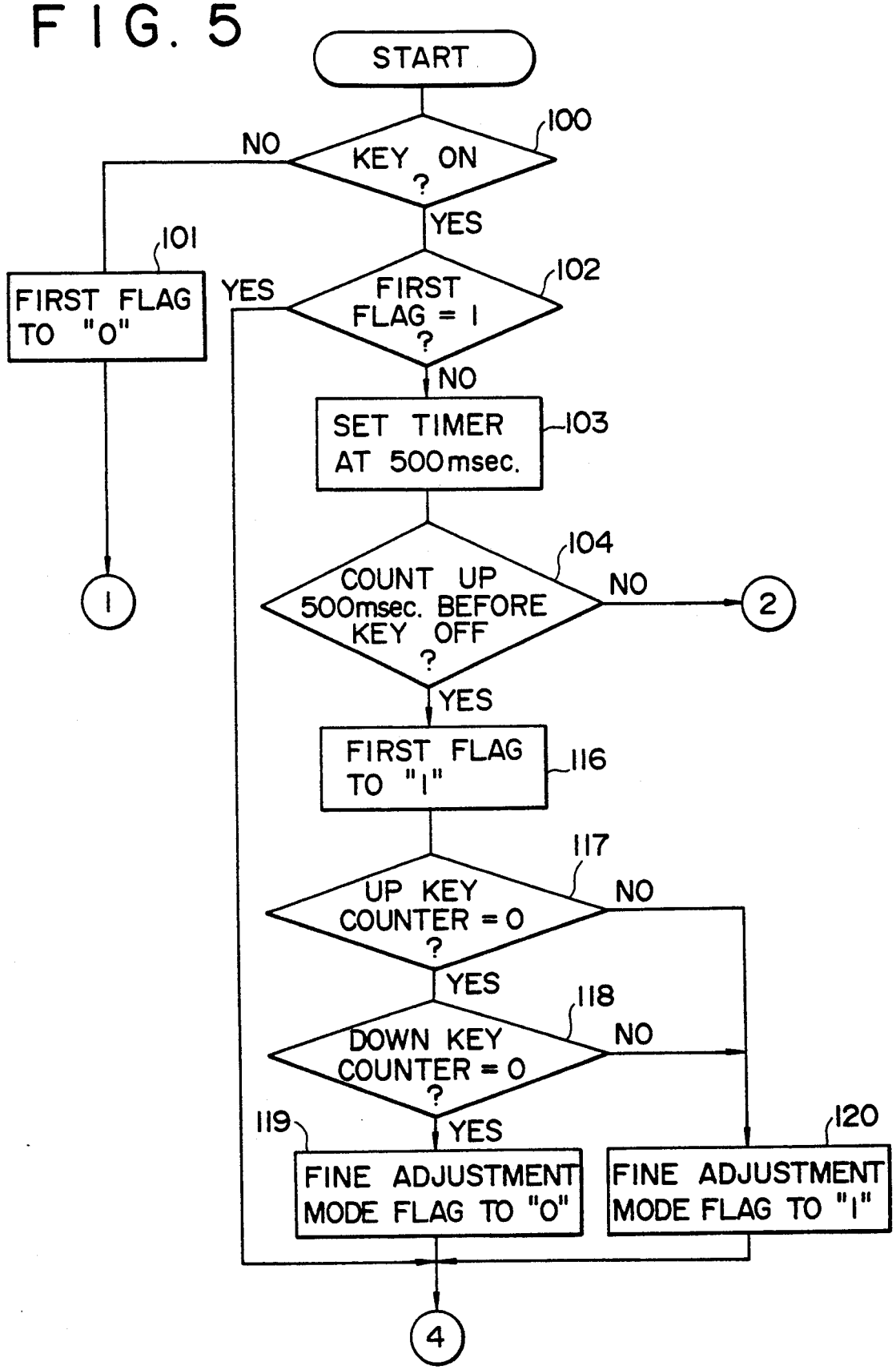
FIGS. 5 to 7 are flowcharts illustrating a fourth embodiment of an electronic volume control system constructed in accordance with the present invention.
Figure 6:
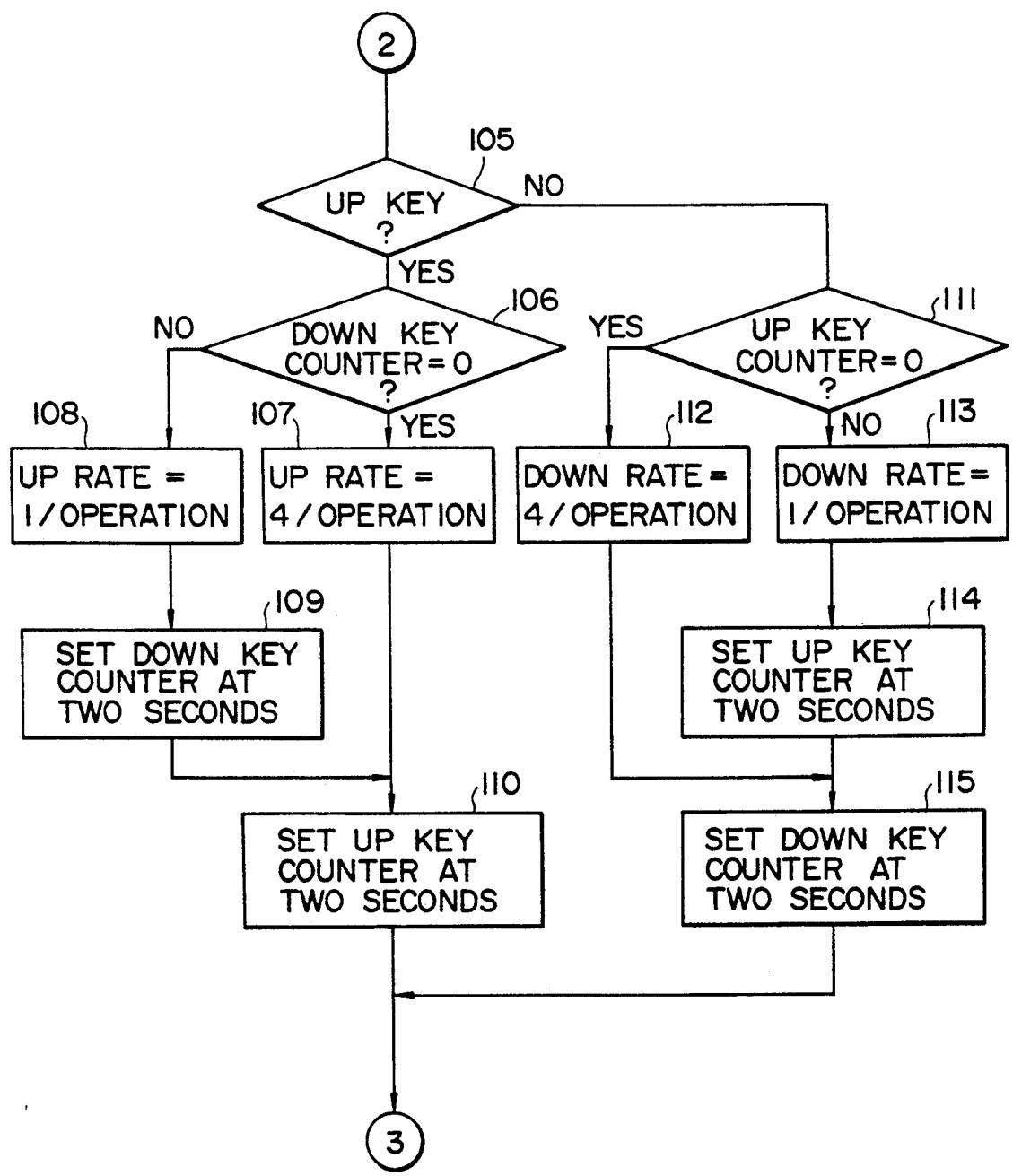
Figure 7:
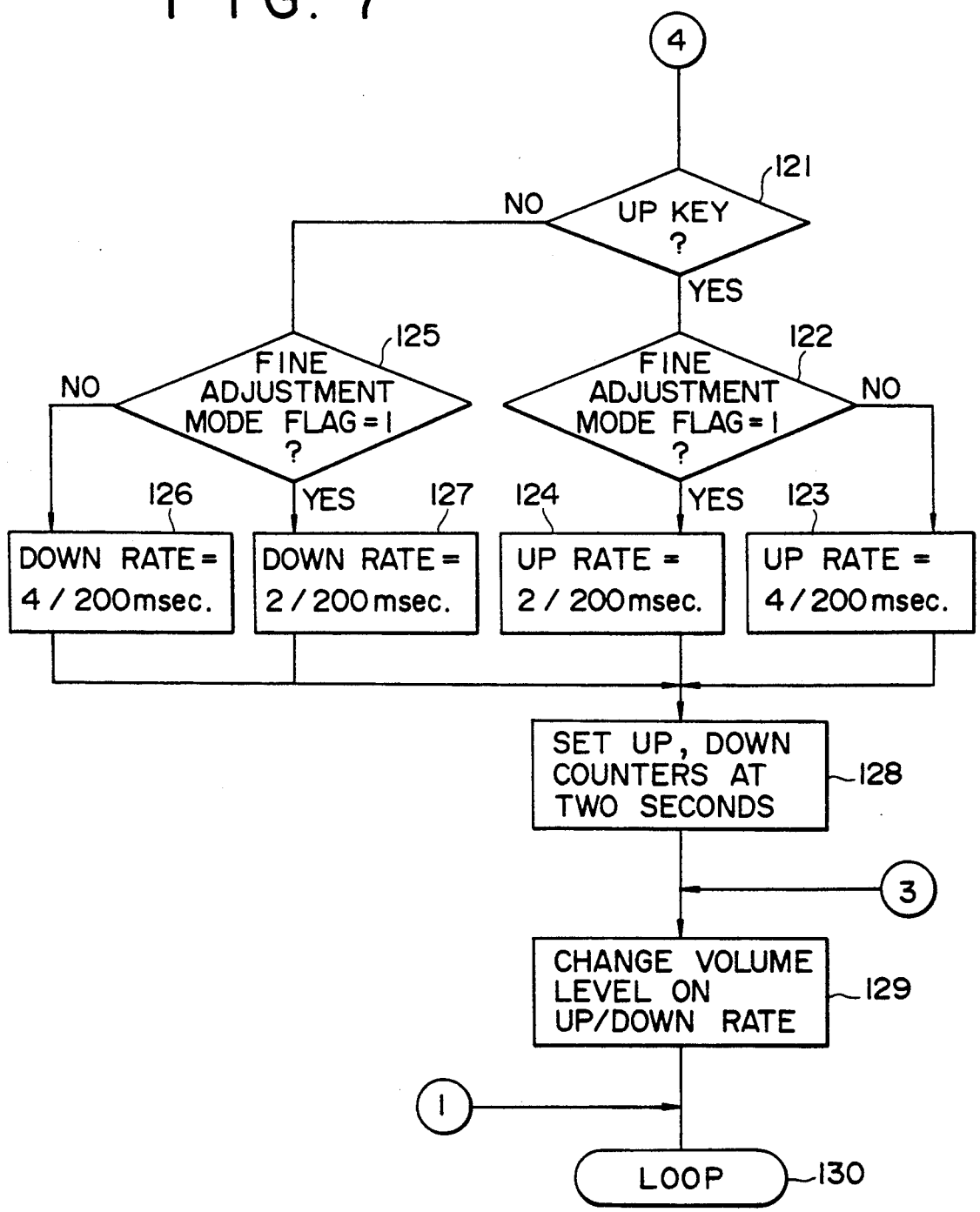

The operation of this electronic volume controller will be described with reference to flowcharts shown in FIGS. 5 to 7.

First of all, the control circuit 3 judges whether or not any key is turned on (step 100). In the key-off state, the control circuit 3 renders the first flag in the memory area 8a "0" (step 101). In the key-on state, the control circuit 3 then judges whether or not the first flag in the memory area 8a is "1" (step 102). The first flag is made "1" in transition to the continuous operation mode and maintained "1" so far as the continuous operation mode continues. As the continuous operation mode is terminated, the first flag becomes "0". If the first flag is "1", the process goes to step 121 bypassing the subsequent steps 103-120.

If the judgment is "NO" at the step 102, the control circuit 3 causes the timer 9 to set the third preset time period equal to 500 msec. (step 103). The control circuit 3 then judges whether or not the third preset time period, 500 msec., is counted up before any key-off operation (step 104). If the judgment is "NO" at the step 104, the control circuit 3 judges that the key operation is a single operation and the process goes to step 105. If the judgment is "YES" at the step 104, the control circuit 3 judges that the key operation is a continuous operation and the process goes to step 116.

Operation after it has been judged at the step 104 that the key operation is the single operation will be described with reference to the flowchart of FIG. 6.

The control circuit 3 first judges whether or not an operation key is the UP key 1 (step 105). If the operated key is the UP key 1, it is then judged whether or not the output of the DOWN-key counter 11 is "0" (step 106). If the judgement is "YES" at the step 106, it means that (1) the UP key 1 has been previously operated in the single operation mode; (2) the time interval from the preceding key-off operation of the DOWN key 2 has exceeded two seconds or (3) the UP key 1 has been previously operated in the single operation fine adjustment mode with the time interval from the key-off operation exceeded two seconds, which will be described in more detail later. In such a case, the UP rate in the single operation mode will be set at step 107. If the judgment is "NO" at the step 106, it means that (1) the time interval from the preceding key-off operation of the DOWN key 2 is less than two seconds or (2) the UP key 1 is previously operated in the single operation fine adjustment mode, with the time interval from the preceding key-off operation of the DOWN key 2 being less than two seconds. In such a case, it is judged that the operation mode is the single operation fine adjustment mode. The UP rate in that fine adjustment mode is set at step 108. In the single operation fine adjustment mode, a value of two seconds is set in the DOWN-key counter 11 at the succeeding step 109. Furthermore, a value of two seconds is also set in the UP-key counter 10 at step 110, irrespectively of whether the controller is in the single operation mode or single operation fine adjustment mode.

If the judgement is "NO" at the step 105, that is, the DOWN key 2 has been operated, the same process as carried out through the steps 106 to 110 is carried out through steps 111 to 115.

Thereafter, the process goes to step 129 whereat the level of volume is changed in accordance with an UP or DOWN rate determined at the step 107, 108, 112 or 113. The process then returns to its start point through a loop 103. In the loop 103, for example, counting-down operations are carried out in the UP-key and DOWN-key counters 10, 11 for each unit time.

When the UP key 1 has been previously operated by the single operation and the DOWN key 2 is now operated by the single operation and if the time interval from when the UP-key counter 11 is set with two seconds at the step 110 to when the DOWN key 2 is turned on is in less than two seconds, the judgement at step 111 is "NO". Thus, the single operation fine adjustment mode will be set at step 113. On the other hand, if the UP key 1 is successively operated twice by the single operation, the DOWN-key counter 11 will not be set with two seconds unless the proceding key operation is in the single operation fine adjustment mode. Therefore, the judgement at the step 106 is "YES". The single operation mode will be continued. In other words, the process will go to the single operation fine adjustment mode only when the succeeding single operation is in the direction opposite to the preceding single operation and the time interval is less than two seconds. This is true of when the DOWN key 2 has been operated by the preceding single operation.

The continuous operation mode and continuous operation fine adjustment mode will be described with reference to the flowcharts shown in FIGS. 5 and 7.

If the judgment at the step 104 is "YES", it is judged that the key operation is the continuous operation. The first flag in the memory area 8a is set at "1" (step 116). It is then judged at steps 117 and 118 whether or not this continuous operation is carried out in less than the time interval, that is, two seconds. At the step 117, it is judged whether or not the output of the UP-key counter 10 is "0". At the step 118, it is judged whether or not the output of the DOWN-key counter 11 is "0". If "NO" in either of the step 117 or 118, the fine adjustment mode flag is set to "1" at step 120. In other words, this operation enables the continuous operation fine adjustment mode to be set. On the other hand, the fine adjustment mode flag can be set to "0" at step 119 only when both the judgments at the steps 117 and 118 are "YES". Namely, the continuous operation mode can be set.

If the fine adjustment mode flag is set to "0" or "1" at the step 119 or 120 or when it is judged at the step 102 that the first flag is "1", it is judged whether or not the operated key is the UP key 1 (step 121). If it is the UP key 1, it is then judged whether or not the fine adjustment mode flag is "1" (step 122). UP rates for the continuous operation fine adjustment mode and continuous operation mode will be set at steps 124 and 123, respectively. Even if the operated key is the DOWN key 2, the same process is carried out through steps 125 to 127. Thereafter, the UP-key and DOWN-key counters 10 and 11 are set to two seconds (step 128). In the subsequent step 129, the level of volume is changed in accordance with UP or DOWN rate which has been set at the step 123, 124, 126 or 127. Thereafter, the process similarly returns to its start point via the loop 130.

So far as the key-on operation is continued in the continuous operation mode or continuous operation fine adjustment mode, the judgments at the steps 100 and 102 become "YES". Thereafter, the loop control returning to the step 100 through the steps 121 to 130 is continuousky carried out. One the key-off operation, the judgment at the step 100 is "NO". Thus, the first flag is set to "0" at the step 101.

A concrete example of volume level control mode when various types of keys are operated after, for example, the UP key 1 has been turned off by the continuous operation, will be described below.

If the DOWN key 2 is operated by the single operation in less than two seconds after the UP key 1 has been operated by the continuous operation, the process goes to step 111 through steps 100-105. At the step 111, the judgment becomes "NO". The system is set to the single operation fine adjustment mode at step 113. If the UP-key 1 is operated by the single operation less than two seconds after the UP-key 1 has been operated by the continuous operation, the judgment at the step 106 becomes "NO". The system is set to the single operation fine control mode at step 108. More particularly, the system will be set to the single operation fine adjustment mode if the single operation is carried out in less than two seconds after the continuous key-off operation, irrespectively of the type of key.

Similarly, after, for example, the UP key 1 has been turned off by the continuous operation and when the continuous operation is again selected, the system is set to the continuous operation fine adjustment mode if the time interval is less than two seconds, irrespectively of the type of key. This is because if the judgment is "NO" in either of the step 117 or 118, the fine adjustment mode flag is set to "1" to set the continuous operation fine adjustment mode.

In order to secure these operations, a value of two seconds is set to the UP-key and DOWN-key counters 10, 11 at step 128 in the preceding continuous operation.

In this embodiment, further, the single operation fine adjustment mode is continued only when the time interval when the same key is repeatedly turned on and off is in less than the second preset time period equal to two seconds after the single operation fine adjustment mode has been set. After the single operation fine adjustment mode for the UP key 1 has been set at the steps 105, 107 or 108 and when a value of two seconds is set to the DOWN-key counter 11 at the step 109 and the UP key 1 is subsequently operated in less than two seconds, the single operation fine adjustment mode can be again continued at the steps 105, 107 and 108. The step 114 is also required to continue the single operation fine adjustment mode by the DOWN key 2.

If both the first and second preset time periods are set to two seconds as in this embodiment, the counting can be performed by the UP-key and DOWN-key counters 10, 11. This is advantageous in that two types of counting operations can be accomplished without any additional counter.

It is to be understood that the present invention is not limited to the aforementioned embodiments. The present invention may be similarly applied to any combination of the aforementioned embodiments. Furthermore, the electronic volume controller of the present invention can be set at the single operation fine adjustment mode when the time interval is less than the first preset time period set to be relatively short, even if two successive single key operation are carried out to change the level of volume in the same direction.

ADVANTAGE OF THE INVENTION

As will be apparent from the foregoing, the present invention can be improve the electronic volume controller in operability since the amount of volume level change in the electronic volume controller can be finely regulated in the opposite or the same directions after the sound volume is rapidly adjusted to a level near the desired volume level.

I claim:

1. An electronic volume control system comprising:
a first operation button for varying the level of volume in the positive direction;
a second operation button for varying the level of volume in the negative direction; and
control means for increasing or decreasing the level of volume by a given amount of volume change in response to the operation of one of said first and second operation buttons, said control means having a fine adjustment mode in which the level of volume can be increased or decreased by another amount of volume change less than said given amount of volume change, said control system being placed into said fine adjustment mode when a time interval, from a time point wherein one of said first and second operation buttons is turned off to another time point wherein one of said first and second operation buttons is turned on, is within a preset time period.

2. The electronic volume control system of claim 1, wherein said control means is placed into said fine adjustment mode only when the operation button previously turned off differs from the operation button subsequently turned on.

3. The electronic volume control system of claim 1, wherein said control means has a single operation gross adjustment mode in which the level of volume is varied by a first amount of volume change during a single operation of one of said first and second operation buttons, and a single operation fine adjustment mode in which the level of volume is varied by a second amount of volume change less than said first amount of volume change during said single operation of one of said first and second operation buttons, the control means operating in said single operation fine adjustment mode when said one of said first and second operation buttons is singly operated and when a time interval from a first time point wherein one of said first and second operation buttons is turned off by a single operation to a second time point wherein one of said first and second operation buttons is turned on by a single operation, is within a first preset time period.

4. The electronic volume control system of claim 3, wherein said control means remains in the single operation fine adjustment mode when a time interval between operations of the same operation button corresponding to said single operation fine adjustment mode is within a second preset time period and wherein if the time interval exceeds said second preset time period, said single operation fine adjustment mode is released.

5. The electronic volume control system of claim 4, wherein said second preset time period is equal to said first preset time period.

6. The electronic volume control system of claim 1, wherein said control means includes:
   a single operation gross adjustment mode in which the level of volume is varied by a first amount of volume change during a single operation of said first and second operation buttons;
   a continuous operation gross adjustment mode in which the level of volume is varied by a second amount of volume change for each unit time during a continuous operation of one of said first and second operation buttons, when said one of said first and second operation buttons is maintained at its ON state for a first preset time period, and
   a first continuous operation fine adjustment mode in which the level of volume is varied by a third amount of volume change less than the second amount of volume change for each unit time when a time interval, from a first time point wherein one of the first and second operation buttons is turned off by a single operation to a second time point, wherein the other operation button is turned on and continuously operated, is within a second preset time period.

7. The electronic volume control system of claim 6, wherein said control means further has a second continuous operation fine adjustment mode in which the level of volume is varied by a fourth amount of volume change less than the second amount of volume change for each unit time when a time interval, from said first time point to a third time point, wherein the same operation button as in the previous button operation is turned on and continuously operated, is within a third preset time period.

8. The electronic volume control system of claim 1, wherein said control means includes:
   a single operation gross adjustment mode in which the level of volume is varied by a first amount of volume change each time during a single operation of one of said first and second operation buttons;
   a continuous operation gross adjustment mode in which the level of volume is varied by a second amount of volume change for each unit time during a continuous operation of one of said first and second operation buttons, when said one of said first and second operation buttons is maintained at its ON state for a first preset time period; and
   a first single operation fine adjustment mode in which the volume level is varied by a third amount of volume change less than the first amount of volume change when a time interval, from a first time point, wherein said one of the first and second operation buttons being continuously operated is released, to a second time point, wherein the other operation button is turned on by a single operation is within a second preset time period.

9. The electronic volume control system of claim 8, wherein said control means further includes:
   a second single operation fine adjustment mode in which the level of volume is varied by a fourth amount of volume change less than the second amount of volume change for each unit time when a time interval from said first time point to a third time point, wherein the same operation button as in the previous button operation is turned on by a single operation, is within a third preset time period.

10. The electronic volume control system of claim 8, wherein said control means remains in the single operation fine adjustment mode when a time interval between operations of the same operation button, corresponding to said single operation of said one of said first and second operating buttons is within a third preset time period and when the time interval exceeds said third preset time period, said single operation fine adjustment mode is released.

11. The electronic volume control system of claim 10, wherein said third preset time period is equal to said second preset time period.

12. The electronic volume control system of claim 1, wherein said control means includes:
   a continuous operation gross adjustment mode in which the level of volume is varied by a first amount of volume change for each unit time during a continuous operation of one of said first and second operation buttons, when said one of said first and second operation buttons is maintained at its ON state for a first preset time period, and
   a first continuous operation fine adjustment mode in which the level of volume is varied by a second amount of volume change less than the first amount of volume change for each unit time when a time interval from a first time point, wherein said one of the first and second operation buttons in said continuous operation is turned off, to a second time point, wherein the other operation button is turned on by said continuous operation, is within a second preset time period.

13. The electronic volume control system of claim 12, wherein said control means further includes:
   a continuous operation fine adjustment mode in which the level of volume is varied by a third amount of volume change less than the first amount of volume change for each unit time when a time interval, from said first time point to a third time point, wherein the same operation button as in the previous button operation is turned on by said continuous operation, is within a third preset time period.

* * * * *